United States Patent
Raza et al.

(10) Patent No.: US 8,090,319 B2
(45) Date of Patent: Jan. 3, 2012

(54) METHOD AND SYSTEM FOR AUTOMATIC FREQUENCY CONTROL OPTIMIZATION

(75) Inventors: Zahir Raza, Waterloo (CA); Phat Tran, Waterloo (CA)

(73) Assignee: Research In Motion Limited, Waterloo, CA (US)

( * ) Notice: Subject to any disclaimer, the term of this patent is extended or adjusted under 35 U.S.C. 154(b) by 519 days.

(21) Appl. No.: 12/394,764

(22) Filed: Feb. 27, 2009

(65) Prior Publication Data

US 2010/0222019 A1  Sep. 2, 2010

(51) Int. Cl.
*H04B 17/00* (2006.01)

(52) U.S. Cl. .......... 455/62; 455/63.3; 455/226.1
(58) Field of Classification Search ............. None
See application file for complete search history.

(56) References Cited

U.S. PATENT DOCUMENTS

| | | | |
|---|---|---|---|
| 6,983,009 B2* | 1/2006 | Lomp | 375/149 |
| 7,139,340 B2 | 11/2006 | Scarpa | |
| 2006/0098716 A1 | 5/2006 | Pietraski et al. | |
| 2010/0075611 A1* | 3/2010 | Budampati et al. | 455/67.11 |

FOREIGN PATENT DOCUMENTS

| | | |
|---|---|---|
| EP | 1028562 A | 8/2000 |
| EP | 1160981 A | 12/2001 |
| WO | WO 02/29978 | 4/2002 |

OTHER PUBLICATIONS

Xueqi Xu et al., "Automatic frequency control: Theory and simulation", IEEE International Conference on Automation and Logistics, 2008, Sep. 1, 2008, pp. 1785-1789, XP031329938 NJ, USA ISBN: 978-1-4244-2502-0, abstract; Sections I-VI.
EP09154064.1, Extended European Search Report dated Oct. 2, 2009.

* cited by examiner

*Primary Examiner* — An Luu
(74) *Attorney, Agent, or Firm* — Moffat & Co.

(57) ABSTRACT

A method and apparatus for automatic frequency control in a receiver of a wireless device, the method determining a channel estimation for a received signal; calculating a signal to noise ratio for the channel estimation; applying a weighting factor determined based on the calculated signal to noise ratio for the channel estimation to the channel estimation to create a weighted channel estimation; and supplying the weighted channel estimation to a voltage controlled oscillator.

16 Claims, 5 Drawing Sheets

METHOD AND SYSTEM FOR AUTOMATIC FREQUENCY CONTROL OPTIMIZATION

FIELD OF THE DISCLOSURE

The present disclosure relates to automatic frequency control and in particular to automatic frequency control systems for mobile communications.

BACKGROUND

In order to accurately demodulate data embedded in radio frequency signals, the received signal needs to be converted to a baseband frequency. In order to do this, the frequency of the transmitter should be matched at the receiver.

In practice, the radio frequency signal received by the receiver is distorted from the signal that was transmitted by the transmitter based on the channel conditions. In order to overcome this, estimations are made of the channel in an attempt to derive a gain and frequency from known data contained in the signal.

In low signal to noise ratio conditions errors in the estimated frequency can lead to undesirable fluctuations in a receiver's frequency control loop.

BRIEF DESCRIPTION OF THE DRAWINGS

The present disclosure will be better understood with reference to the drawings in which.

DETAILED DESCRIPTION

The present disclosure provides a method for automatic frequency control in a receiver of a wireless device comprising: determining a channel estimation for a received signal; calculating a signal to noise ratio for the channel estimation; applying a weighting factor determined based on the calculated signal to noise ratio for the channel estimation to the channel estimation to create a weighted channel estimation; and supplying the weighted channel estimation to a voltage controlled oscillator.

The present disclosure further provides a communications subsystem in a mobile device comprising: a channel estimation block, the channel estimation block receiving a signal from a down converter and providing a channel estimation for phase and frequency errors in the signal; a phase differential block to determine a phase offset for the signal; a frequency offset block to determine a frequency error; a weighting function block configured to determine a weighting function based on a signal to noise ratio for the channel estimation, the weighting function block providing a weighted channel estimation; a converter block to convert the weighted channel estimation to volts; and a voltage controlled oscillator receiving the converted weighted channel estimation and providing an input to the down converter.

When a user equipment is in poor channel conditions, or more specifically when a user equipment is in a low signal-to-noise ratio condition, the use of conventional techniques to improve estimates for the transmitter frequency can degrade, leading to undesirable fluctuations in frequency estimates.

Figure 1:
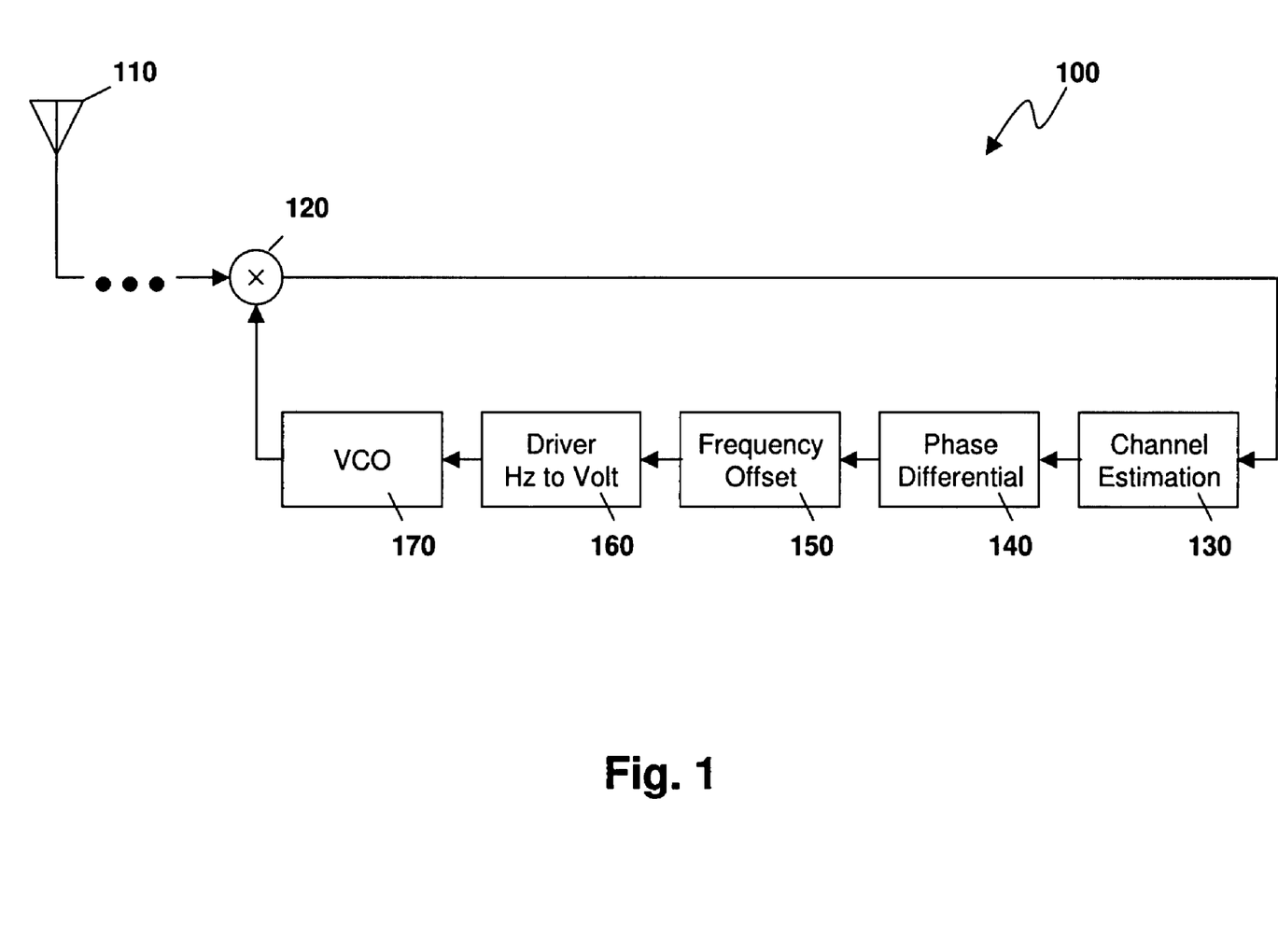
FIG. 1 is a block diagram of a conventional frequency correction system.

Reference is now made to FIG. 1. FIG. 1 shows a conventional frequency control system 100 where a receiver 110 receives a downlink signal. As will be appreciated, such downlink signal comes from the base station to the user equipment and various coding of the signal is possible. Examples of such coding include the global system for mobile communications (GSM), code divisional multiple access (CDMA), universal mobile telecommunications system (UMTS), wideband code division multiple access (WCDMA), among others.

In the present disclosure, a UMTS system and terminology associate with UMTS is utilized. However, this is not meant to be limiting and the present disclosure could equally applied to various radio technologies.

In the system 100, the received signal or symbol is converted to a baseband signal at multiplier 120.

A feedback loop is established where a channel estimation at channel estimation block 130 occurs. As will be appreciated, channel estimation block 130 attempts to derive signal shift from known elements to find changes in both the amplitude and the phase of the received signal from the expected values. Thus, if a constant phase shift is occurring, this is determined at the channel estimation block 130.

The estimated signal is then provided to a phase differential block 140, in which an average phase shift is sought. As will be appreciated, under certain channel conditions, the channel causes a stable phase shift in the signal and the phase differential block 140 looks for the average phase shift. Furthermore, different signaling systems can have different methods of frequency estimation that does not require a phase differential block. For example, GSM does not require a phase differential of the channel estimates for frequency estimation.

The output from the phase differential block 140 is provided to a frequency offset block 150. Frequency offset block 150 transfers the phase differentials to a frequency. The frequency is then fed to a converter, which converts the frequency to a voltage as seen by block 160. The voltage from block 160 is provided to a voltage controlled oscillator 170 which provides an oscillation that is input to multiplier 120.

As seen from FIG. 1, the conventional frequency control system 100 therefore estimates phase and amplitude adjustments to symbols. The channel estimate factors from block 130 are then used to extract the average phase difference over a set of received symbols at block 140, from which a frequency offset between the received signal and the current oscillator setting is derived at block 150. This frequency offset is converted to volts from hertz at block 160 and applied to a voltage controlled oscillator 170 to adapt the down converter. In other words, the down converter requires multiplication by the central frequency plus the frequency offset derived in block 150.

The conventional frequency control system 100 therefore does not take into account the reliability of channel estimates from the channel estimation block 130. The channel estimates derived at channel estimation block 130 degrade in terms of their reliability as the signal to noise ratio is reduced. To introduce a factor of reliability, the present disclosure provides for a weighting function that is applied to each frequency offset based on the quality of channel estimates from which the frequency offset is derived.

In the present disclosure, the weighting function is a system configurable function with parameters that are adjusted to the application, allowing the present disclosure to be used for various purposes.

In particular, the weighting function is a function of the signal to noise ratio of the channel estimates. A low signal to noise ratio in a multipath or noisy environment can lead to the receiver to fail to converge to the true frequency of the signal.

Figure 2:
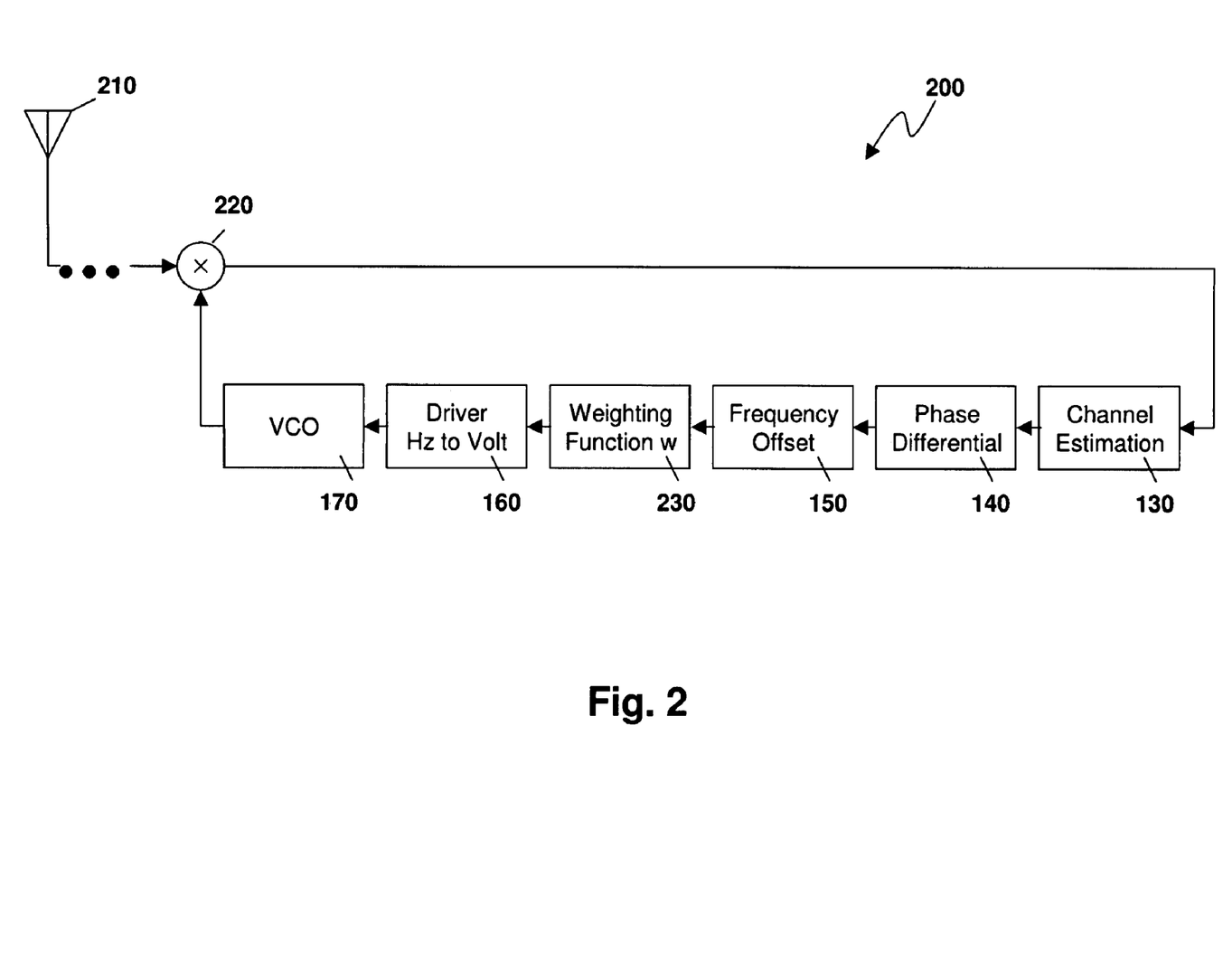
FIG. 2 is a block diagram of a frequency correction system having a weighting function based on channel conditions.

Reference is now made to FIG. 2.

The frequency control system 200 of FIG. 2 provides a down converter 220 to down convert a received signal from receiver 210. The down converter 220 further has a feedback function which has an input based on channel estimations, as in FIG. 1.

In particular, a channel estimation block 130, phase differential block 140, frequency offset block 150, converter block 160 and voltage controlled oscillator 170 are provided and provide similar functionality to those blocks in FIG. 1.

A weighting function block 230 is however added. The weighting function block 230, in one embodiment, provides a indication of the reliability of the channel estimation derived in block 130, thereby providing more accurate feedback to voltage controlled oscillator 170.

As will be appreciated, when a high signal-to-noise ratio exists, the quality of the received signal is high, providing for more accurate channel estimation at channel estimation block 130. When the signal-to-noise ratio is however low, the estimates derived by channel estimation block 130 can be corrupt and therefore need to be weighted with appropriate reliability.

In one embodiment, a linear weighting function is possible. One exemplary weighting function is as follows:

$$w_n = f(SNR_{Ch\_Est,n}) \quad \text{Formula 1}$$

$$= \begin{cases} 1, & \text{for } SNR_{Ch\_Est,n} \geq SNR_{max} \\ \dfrac{\left(\dfrac{SNR_{Ch\_Est,n} -}{SNR_{min}}\right)}{\left(\dfrac{SNR_{max} -}{SNR_{min}}\right)}, & \text{for } SNR_{max} > SNR_{Ch\_Est,n} > SNR_{min} \\ 0, & \text{for } SNR_{Ch\_Est,n} \leq SNR_{min} \end{cases}$$

From the above, the weight w for a particular frequency offset estimate is a function of the signal-to-noise ratio of the received signal from which the frequency error was estimated. The function is linear and if the signal-to-noise ratio for the channel estimate is greater then a maximum predefined signal-to-noise ratio then the channel is considered reliable and the weighting function is set to one. In one embodiment the maximum signal to noise ratio is the minimum signal to noise ratio plus a predetermined offset value.

Conversely, if the signal-to-noise ratio for the channel estimate is between the minimum signal-to-noise ratio and the maximum signal-to-noise ratio, then a function can be derived. In the example of Formula 1 above, the weighting function is the signal-to-noise ratio for the channel estimate minus the minimum signal-to-noise ratio, all divided by the difference between the maximum signal-to-noise ratio and the minimum signal-to-noise ratio.

Finally, if the signal-to-noise ratio of the channel estimate is below a minimum signal-to-noise ratio then the weighting function can designate a zero for the sample or symbol.

Figure 4:
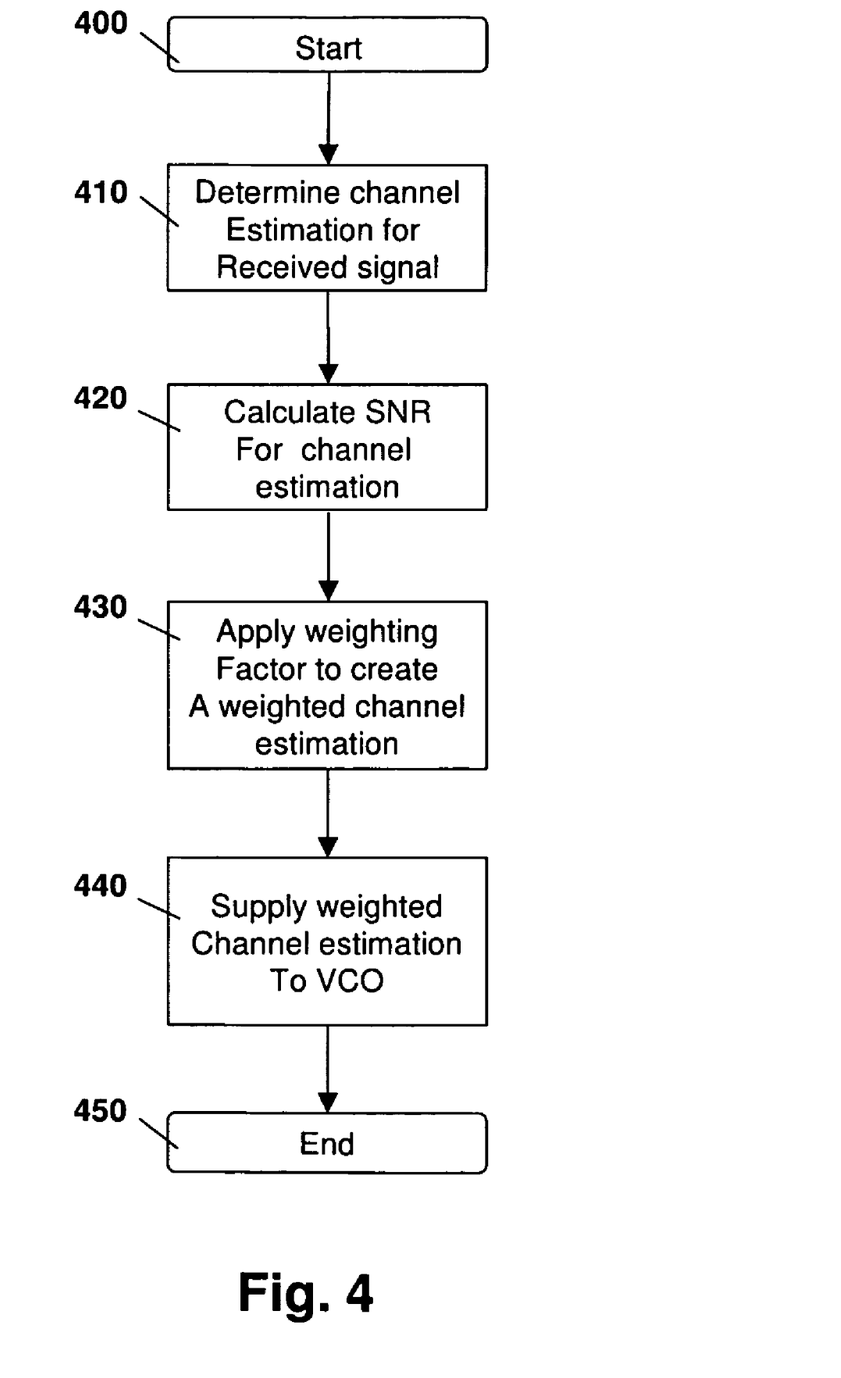
FIG. 4 is a flow diagram showing a method for the frequency control system of FIG. 2.

The above is summarized with regard to FIG. 4. In particular, FIG. 4 illustrates a flow diagram for the steps illustrated by the block diagram of FIG. 2.

The process in FIG. 4 starts at block 400 and proceeds to block 410 in which a channel estimation is determined for a received signal.

The process then proceeds to block 420 in which a signal to noise ratio is calculated for the channel estimation.

A weighting function is then applied in block 430 to the calculated signal to noise ratio to create a weighted channel estimation.

The process then proceeds to block 440 in which the weighted channel estimation is supplied to a voltage controlled oscillator which then provides the feedback as illustrated in FIG. 2.

The process then proceeds to block 450 and ends.

Figure 3:
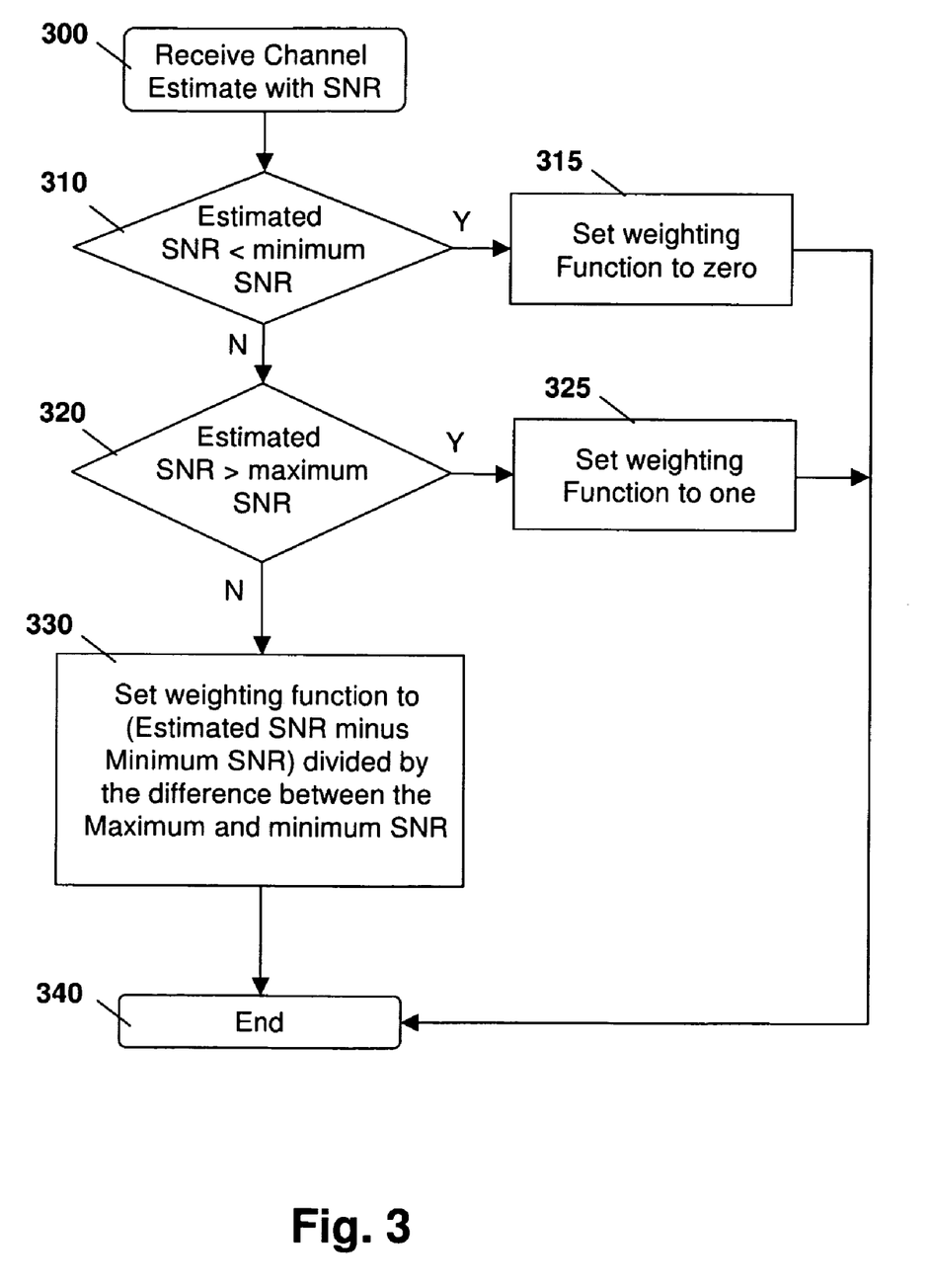
FIG. 3 is a block diagram of a process for determining a weighting function.

A method for implementing Formula 1 on a mobile device is illustrated with reference to FIG. 3. In FIG. 3 a precondition is that a channel estimate with an estimated signal to noise ratio is received at block 300.

The process then proceeds to block 310 in which a check is made to determine whether the estimated signal to noise ratio is below a minimum signal to noise ratio threshold. The minimum signal to noise ratio threshold is represented as $SNR_{min}$ in Formula 1 above.

If yes, the process proceeds to block 315 in which the weighting function is set to zero. As will be appreciated, this indicates to subsequent processing elements that the channel estimate should be ignored for frequency correction purposes.

Conversely, if it is found in block 310 that the estimated signal to noise ratio is greater than the minimum signal to noise ratio threshold, the process proceeds to block 320. In block 320 a check is made to determine whether the estimated signal to noise ratio is greater than the maximum signal to noise ratio.

If the estimated signal to noise ratio is greater than the maximum signal to noise, then the estimate is determined to be reliable and the process proceeds to block 325 in which the weighting function is set to one.

If it is determined in block 320 that the estimated signal to noise ratio is not greater than the maximum signal to noise ratio, the combination of blocks 310 and 320 indicate that the estimated signal to noise ratio is between the minimum signal to noise ratio and the maximum signal to noise ratio. In this case the process proceeds to block 330 in which the linear function as described in Formula 1 above is applied to the weighting function. Specifically, utilizing Formula 1 above, the minimum signal to noise ratio is subtracted from the estimated signal to noise ratio, and the result is divided by the difference between the maximum signal to noise ratio and minimum signal to noise ratio.

From blocks 315, 325 or 330 the process proceeds to block 340 and ends.

The weighting function, as illustrated by Formula 1 and FIG. 3 above, is merely meant to be exemplary of a type of weighting function that can be added to an automatic frequency control system. In alternate embodiments, other linear or non-linear functions could be utilized to weight the channel estimate.

The above therefore takes into account the minimum operating range of a channel estimation unit, which is the source of the derived frequency offsets or corrections. In this way, any deviation introduced by the channel estimation unit when below an operating signal-to-noise ratio implies a deviation to the derived frequency correction and could lead to loss of signal on a wireless handheld or loss of performance or reception in areas where the signal-to-noise ratio is at or below the maximum signal-to-noise ratio as described above.

As will be appreciated, the signal-to-noise ratio is provided above. However, in other technologies, the Energy per Chip (Eclo) is utilized instead of signal-to-noise ratio, but similar functionality can be provided utilizing a weight function 230. Other measures of channel quality such as, but not limited to, bit error rates equally be used. All of the measures of channel quality are generally referred to herein as "Signal to Noise Ratio" or "SNR", and the present disclosure is not limited to a particular measure of channel quality.

The use of the weighting function improves the performance of the mobile receiver in areas where the signal-to-noise ratio is low, such as cell boundary regions, particularly during handover from third generation (3G) cells to second generation cells, among others.

The present system and methods could be utilized with a variety of mobile devices. One exemplary mobile device is described below with reference to FIG. 5. This is not meant to be limiting, but is provided for illustrative purposes.

Figure 5:
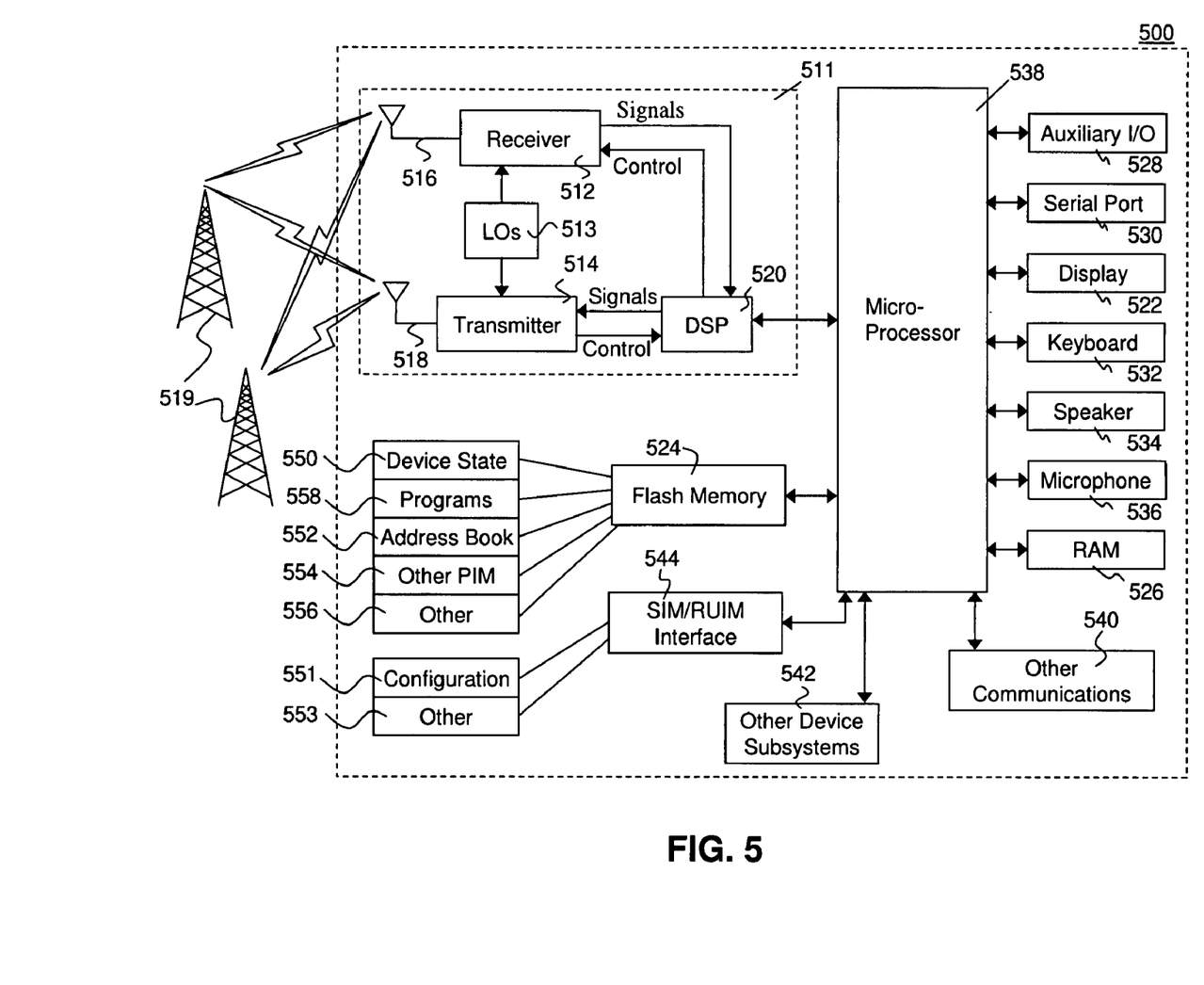
FIG. 5 is a block diagram of an exemplary mobile device that may be used with the method and system of the present disclosure.

FIG. 5 is a block diagram illustrating a mobile device capable of being used with preferred embodiments of the apparatus and method of the present application. Mobile device 500 is preferably a two-way wireless communication device having at least voice and data communication capabilities. Mobile device 500 preferably has the capability to communicate with other computer systems on the Internet. Depending on the exact functionality provided, the wireless device may be referred to as a data messaging device, a two-way pager, a wireless e-mail device, a cellular telephone with data messaging capabilities, a wireless Internet appliance, or a data communication device, as examples.

Where mobile device 500 is enabled for two-way communication, it will incorporate a communication subsystem 511, including both a receiver 512 and a transmitter 514, as well as associated components such as one or more, preferably embedded or internal, antenna elements 516 and 518, local oscillators (LOs) 513, and a processing module such as a digital signal processor (DSP) 520. As will be apparent to those skilled in the field of communications, the particular design of the communication subsystem 511 will be dependent upon the communication network in which the device is intended to operate.

Network access requirements will also vary depending upon the type of network 519. In some CDMA networks network access is associated with a subscriber or user of mobile device 500. A CDMA mobile device may require a removable user identity module (RUIM) or a subscriber identity module (SIM) card in order to operate on a CDMA network. The SIM/RUIM interface 544 is normally similar to a card-slot into which a SIM/RUIM card can be inserted and ejected like a diskette or PCMCIA card. The SIM/RUIM card can have approximately 64K of memory and hold many key configuration 551, and other information 553 such as identification, and subscriber related information.

When required network registration or activation procedures have been completed, mobile device 500 may send and receive communication signals over the network 519. As illustrated in FIG. 5, network 519 can consist of multiple base devices communicating with the mobile device. For example, in a hybrid CDMA 1× EVDO system, a CDMA base device and an EVDO base device communicate with the mobile device and the mobile device is connected to both simultaneously. The EVDO and CDMA 1× base stations use different paging slots to communicate with the mobile device.

Signals received by antenna 516 through communication network 519 are input to receiver 512, which may perform such common receiver functions as signal amplification, frequency down conversion, filtering, channel selection and the like, and in the example system shown in FIG. 5, analog to digital (A/D) conversion. A/D conversion of a received signal allows more complex communication functions such as demodulation and decoding to be performed in the DSP 520. The communication subsystem could include the feedback loop of FIG. 2 for demodulation.

In a similar manner, signals to be transmitted are processed, including modulation and encoding for example, by DSP 520 and input to transmitter 514 for digital to analog conversion, frequency up conversion, filtering, amplification and transmission over the communication network 519 via antenna 518. DSP 520 not only processes communication signals, but also provides for receiver and transmitter control. For example, the gains applied to communication signals in receiver 512 and transmitter 514 may be adaptively controlled through automatic gain control algorithms implemented in DSP 520.

Mobile device 500 preferably includes a microprocessor 538 which controls the overall operation of the device. Communication functions, including at least data and voice communications, are performed through communication subsystem 511. Microprocessor 538 also interacts with further device subsystems such as the display 522, flash memory 524, random access memory (RAM) 526, auxiliary input/output (I/O) subsystems 528, serial port 530, one or more keyboards or keypads 532, speaker 534, microphone 536, other communication subsystem 540 such as a short-range communications subsystem and any other device subsystems generally designated as 542. Serial port 530 could include a USB port or other port known to those in the art.

Some of the subsystems shown in FIG. 5 perform communication-related functions, whereas other subsystems may provide "resident" or on-device functions. Notably, some subsystems, such as keyboard 532 and display 522, for example, may be used for both communication-related functions, such as entering a text message for transmission over a communication network, and device-resident functions such as a calculator or task list.

Operating system software used by the microprocessor 538 is preferably stored in a persistent store such as flash memory 524, which may instead be a read-only memory (ROM) or similar storage element (not shown). Those skilled in the art will appreciate that the operating system, specific device applications, or parts thereof, may be temporarily loaded into a volatile memory such as RAM 526. Received communication signals may also be stored in RAM 526.

As shown, flash memory 524 can be segregated into different areas for both computer programs 558 and program data storage 550, 552, 554 and 556. These different storage types indicate that each program can allocate a portion of flash memory 524 for their own data storage requirements. Microprocessor 538, in addition to its operating system functions, preferably enables execution of software applications on the mobile device. A predetermined set of applications that control basic operations, including at least data and voice communication applications for example, will normally be installed on mobile device 500 during manufacturing. Other applications could be installed subsequently or dynamically.

A preferred software application may be a personal information manager (PIM) application having the ability to organize and manage data items relating to the user of the mobile device such as, but not limited to, e-mail, calendar events, voice mails, appointments, and task items. Naturally, one or more memory stores would be available on the mobile device to facilitate storage of PIM data items. Such PIM application would preferably have the ability to send and receive data items, via the wireless network 519. In a preferred embodiment, the PIM data items are seamlessly integrated, synchronized and updated, via the wireless network 519, with the mobile device user's corresponding data items stored or associated with a host computer system. Further applications may also be loaded onto the mobile device 500 through the network 519, an auxiliary I/O subsystem 528, serial port 530, short-range communications subsystem 540 or any other suitable subsystem 542, and installed by a user in the RAM 526 or preferably a non-volatile store (not shown) for execution by the microprocessor 538. Such flexibility in application installation increases the functionality of the device and may provide enhanced on-device functions, communication-related functions, or both. For example, secure communication applications may enable electronic commerce functions and other such financial transactions to be performed using the mobile device 500.

In a data communication mode, a received signal such as a text message or web page download will be processed by the communication subsystem 511 and input to the microprocessor 538, which preferably further processes the received signal for output to the display 522, or alternatively to an auxiliary I/O device 528.

A user of mobile device 500 may also compose data items such as email messages for example, using the keyboard 532, which is preferably a complete alphanumeric keyboard or telephone-type keypad, in conjunction with the display 522 and possibly an auxiliary I/O device 528. Such composed items may then be transmitted over a communication network through the communication subsystem 511.

For voice communications, overall operation of mobile device 500 is similar, except that received signals would preferably be output to a speaker 534 and signals for transmission would be generated by a microphone 536. Alternative voice or audio I/O subsystems, such as a voice message recording subsystem, may also be implemented on mobile device 500. Although voice or audio signal output is preferably accomplished primarily through the speaker 534, display 522 may also be used to provide an indication of the identity of a calling party, the duration of a voice call, or other voice call related information for example.

Serial port 530 in FIG. 5, would normally be implemented in a personal digital assistant (PDA)-type mobile device for which synchronization with a user's desktop computer (not shown) may be desirable, but is an optional device component. Such a port 530 would enable a user to set preferences through an external device or software application and would extend the capabilities of mobile device 500 by providing for information or software downloads to mobile device 500 other than through a wireless communication network. The alternate download path may for example be used to load an encryption key onto the device through a direct and thus reliable and trusted connection to thereby enable secure device communication. As will be appreciated by those skilled in the art, serial port 530 can further be used to connect the mobile device to a computer to act as a modem.

Other communications subsystems 540, such as a short-range communications subsystem, is a further optional component which may provide for communication between mobile device 500 and different systems or devices, which need not necessarily be similar devices. For example, the subsystem 540 may include an infrared device and associated circuits and components or a Bluetooth™ communication module to provide for communication with similarly enabled systems and devices.

The embodiments described herein are examples of structures, systems or methods having elements corresponding to elements of the techniques of this application. This written description may enable those skilled in the art to make and use embodiments having alternative elements that likewise correspond to the elements of the techniques of this application. The intended scope of the techniques of this application thus includes other structures, systems or methods that do not differ from the techniques of this application as described herein, and further includes other structures, systems or methods with insubstantial differences from the techniques of this application as described herein.

The invention claimed is:

1. A method for automatic frequency control in a receiver of a wireless device comprising:
   determining a channel estimation for a received signal;
   calculating a signal to noise ratio for the channel estimation;
   applying a weighting factor determined based on the calculated signal to noise ratio for the channel estimation to the channel estimation to create a weighted channel estimation; and
   supplying the weighted channel estimation to a voltage controlled oscillator.

2. The method of claim 1, wherein the weighting factor is determined based on a predetermined minimum signal to noise ratio.

3. The method of claim 2, wherein the weighting factor is zero if the channel estimation signal to noise ratio is less than the predetermined minimum signal to noise ratio.

4. The method of claim 2, wherein the weighting factor is further determined based on a predetermined maximum signal to noise ratio, the maximum signal to noise ratio being a predetermined offset value above the minimum signal to noise ratio.

5. The method of claim 4, wherein the weighting factor is one if the channel estimation signal to noise ratio is greater than the maximum signal to noise ratio.

6. The method of claim 4, wherein the weighting factor is a linearly varied value if the channel estimation signal to noise ratio is between the predetermined minimum signal to noise ratio and the maximum signal to noise ratio.

7. The method of claim 6, wherein the weighting factor equals the minimum signal to noise ratio subtracted from the channel estimation signal to noise ratio, the value of which is further divided by the difference between the maximum signal to noise ratio and the minimum signal to noise ratio.

8. The method of claim 1, further comprising converting the weighted channel estimation to volts.

9. The method of claim 1, further comprising applying an output from the voltage controlled oscillator to a down converter.

10. A communications subsystem in a mobile device comprising:
   a channel estimation block, the channel estimation block receiving a signal from a down converter and providing a channel estimation for phase and frequency errors in the signal;
   a phase differential block to determine a phase offset for the signal;
   a frequency offset block to determine a frequency error;
   a weighting function block configured to determine a weighting function based on a signal to noise ratio for the channel estimation, the weighting function block providing a weighted channel estimation;
   a converter block to convert the weighted channel estimation to volts; and
   a voltage controlled oscillator receiving the converted weighted channel estimation and providing an input to the down converter.

11. The communications subsystem of claim 10, wherein the weighting factor is determined based on a predetermined minimum signal to noise ratio.

12. The communications subsystem of claim 11, wherein the weighting factor is zero if the channel estimation signal to noise ratio is less than the predetermined minimum signal to noise ratio.

13. The communications subsystem of claim 11, wherein the weighting factor is further determined based on a maximum signal to noise ratio, the maximum signal to noise ratio being a predetermined offset value above the minimum signal to noise ratio.

14. The communications subsystem of claim 13, wherein the weighting factor is one if the channel estimation signal to noise ratio is greater than the maximum signal to noise ratio.

15. The communications subsystem of claim 13, wherein the weighting factor is a linearly varied value if the channel estimation signal to noise ratio is between the predetermined minimum signal to noise ratio and the maximum signal to noise ratio.

16. The communications subsystem of claim 15, wherein the weighting factor equals the minimum signal to noise ratio subtracted from the channel estimation signal to noise ratio, the value of which is further divided by the difference between the maximum signal to noise ratio and the minimum signal to noise ratio.

* * * * *